United States Patent [19]
Daberkow et al.

[11] Patent Number: 6,061,085
[45] Date of Patent: May 9, 2000

[54] CAMERA SYSTEM FOR A TRANSMISSION ELECTRON MICROSCOPE

[75] Inventors: Ingo Daberkow, Everswinkel; Manfred Schierjott, Datteln; Jürgen Tümpner, Münster, all of Germany

[73] Assignee: Soft Imaging System GmbH, Munster, Germany

[21] Appl. No.: 09/008,009

[22] Filed: Jan. 16, 1998

[30] Foreign Application Priority Data

Feb. 7, 1997 [DE] Germany ............................ 197 04 723
Nov. 28, 1997 [DE] Germany ............................ 197 52 724

[51] Int. Cl.[7] ................................ H04N 7/18; H04N 9/47
[52] U.S. Cl. ................................ 348/80; 348/79; 250/311
[58] Field of Search ................ 348/79, 80, 93; 250/310, 311; H04N 7/18, 9/47

[56] References Cited

U.S. PATENT DOCUMENTS

| 4,514,629 | 4/1985 | Smith et al. | 250/311 |
| 4,739,399 | 4/1988 | Swann . | |
| 4,777,523 | 10/1988 | Yokoto et al. | 250/311 |
| 5,517,033 | 5/1996 | Krivanek . | |
| 5,536,941 | 7/1996 | Swann | 250/311 |

*Primary Examiner*—Howard Britton
*Assistant Examiner*—Nhon T. Diep
*Attorney, Agent, or Firm*—Herbert Dubno

[57] ABSTRACT

A camera system for a transmission electron microscope includes a luminescent screen and prism within the transmission electron microscope evacuated housing and a camera outside the housing. An optical lens system between the prism and the camera can be provided on opposite sides of a wall of the housing have a vacuum window. The luminescent screen, prism, optical lens system and camera have a common structure fixedly connecting them together and enabling them to shift relative to the electron beam via a pneumatic effector.

8 Claims, 2 Drawing Sheets

CAMERA SYSTEM FOR A TRANSMISSION ELECTRON MICROSCOPE

FIELD OF THE INVENTION

Our present invention relates to a transmission electron microscope and, more particularly, to a camera system for registering, in optical form, a photon image converted from the electron image of the transmission electron microscope (TEM).

BACKGROUND OF THE INVENTION

A transmission electron microscope, in addition to its evacuated housing and the electron beam generator thereof, includes a system for forming an electron beam image of the object, article or material which is subjected to the electron beam microscope and for outputting the electron image. In addition, the transmission electron microscope can include a luminescent screen which can be inserted into the electron beam path for transforming the electron image into a photon image, an optical element for rerouting the photon image through a right angle to the electron beam, and a camera which can be connected to the optical element by an optical lens system so that the camera can register optically the photon image corresponding to the electron image.

In a camera system of this type (see U.S. Pat. No. 5,517,033) the optical lens system in the camera are rigid with the projection chamber and only the luminescent screen and the rerouting optical device need be movable within the projection chamber. While this does give rise to a very simple mechanical system, it has the drawback that positioning of the luminescent screen and the rerouting element relative to the lens optics and the camera cannot be reproducible to less than a fraction of a millimeter and thus the camera system cannot be used for high resolution image formation.

In another camera system for an electron transmission microscope, the luminescent screen is connected with a CCD camera by a fiber optics system (U.S. Pat. No. 4,739, 399). Here the luminescent screen, the fiber optics and the CCD camera are provided as a single rigid structural unit within the projection camera and both the luminescent screen and the CCD camera directly adjoin the optical fiber ends. The drawback of this system is that the image sensor of the CCD camera must have the same size as the luminescent screen and thus is prohibitively expensive.

OBJECTS OF THE INVENTION

It is, therefore, the principal object of the present invention to provide a camera system for a transmission electron microscope which can produce a high resolution image without the drawbacks of the earlier systems as outlined above.

Another object of the invention is to provide an improved camera system for a transmission electron microscope in which relative movement between the luminescent screen and the optical rerouting element, on the one hand, and the optical lens system and the camera, on the other hand, is not a problem.

It is also an object of this invention to provide a high resolution camera system for a transmission electron microscope which can use a camera, especially a charge-coupled device (CCD) camera, of smaller size than the luminescent screen.

SUMMARY OF THE INVENTION

These objects and others which will become apparent hereinafter by providing in a transmission electron microscope, a luminescent screen and rerouting element within the housing of the transmission electron microscope, a camera outside the housing of the transmission electron microscope and a structure for rigidly connecting the luminescent screen, the rerouting element, the optical lens system and the camera so that these elements together with the structure form a unit which is shiftable relative to the electron beam and to the housing.

According to the invention, high resolution images can be obtained because with the system of the invention it is no longer necessary to use large format cost-intensive camera sensors and there is no loss of resolution because of a lack of precision in repositioning the need to precisely position the luminescent screen and rerouting element on the one hand and the optical lens system and camera on the other hand.

It has been found that the system of the invention also facilitates variation or selection of the image ratio or scale of reproduction and thus optimum matching of the resolution of the luminescent screen, which is dependent upon the high voltage applied thereto, to the resolution of the camera. Furthermore, by the use of an appropriate ancillary lens, the sensitivity can be significantly increased. It has been found that, with such lens, correction of spherical aberration is possible to eliminate spherical aberration effect which may be contributed by the optical characteristics of the rerouting element and the vacuum window required in the projection chamber wall which is straddled by the camera system of the invention.

A transmission electron microscope of the invention can then comprise:

a housing;

an electron beam generator on the housing directing an electron beam along a transmission electron microscopy path within the housing;

a luminescent screen in the housing transverse to the path and insertable in the path for transforming an electron image into a photon image;

an optical element juxtaposed with the luminescent screen for rerouting the photon image through a right angle;

a camera outside the housing in optical alignment with the optical element for registering the photon image;

a focussing lens optics spaced from the optical element and the camera and in optical alignment with the optical element and the camera; and a structure fixing the luminescent screen, the optical element, the camera and the focussing lens optics together for joint movement relative to the path. Preferably the rerouting element is a prism, although a mirror can also be used. The camera preferably is a high resolution CCD camera and the shifting of the unit can be effected by a pneumatic unit acting upon the slide formed by the structure.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
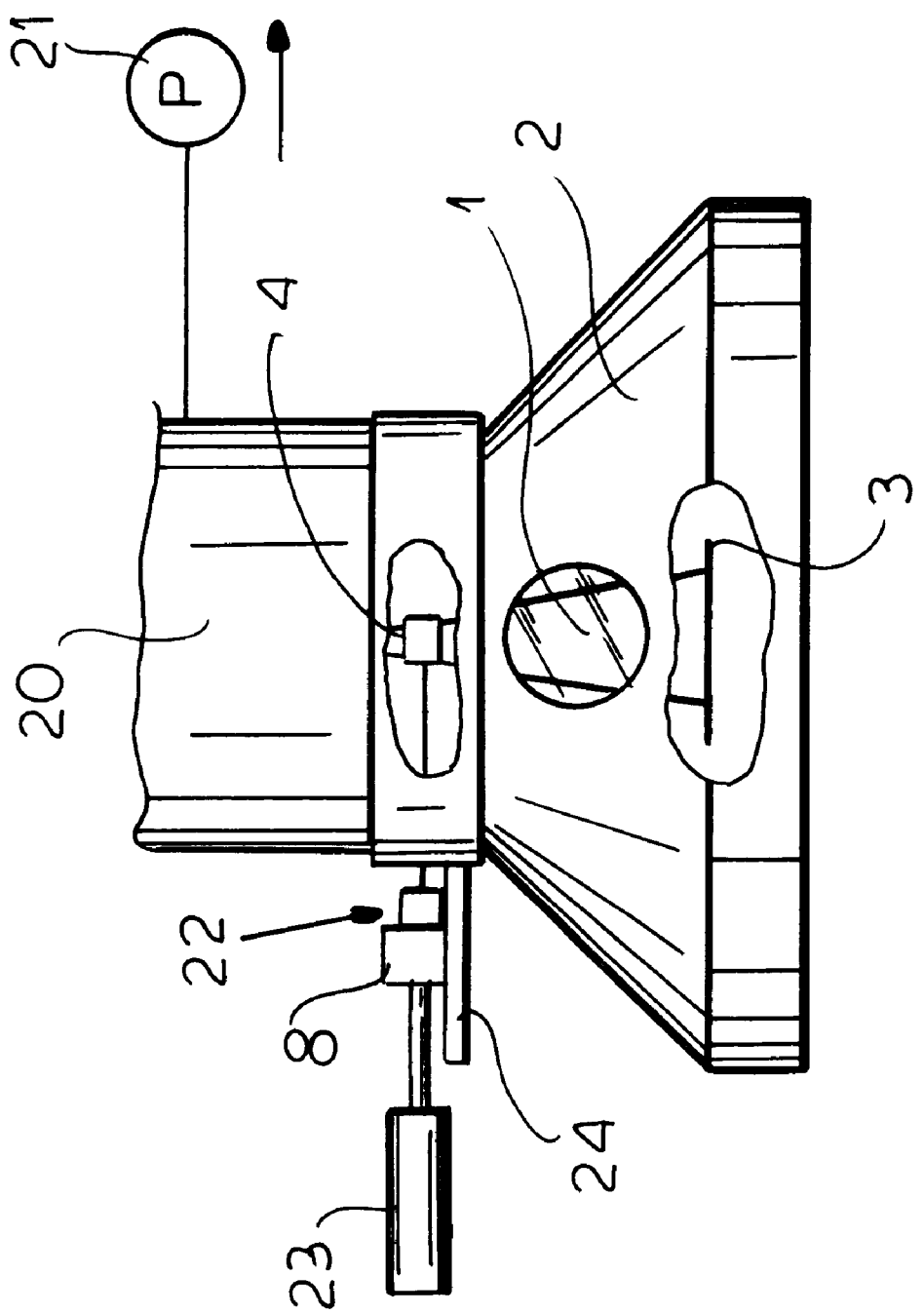
FIG. 1 is a highly diagrammatic side elevational view of a portion of an electron transmission microscope provided with the camera system of the invention.
Figure 2:
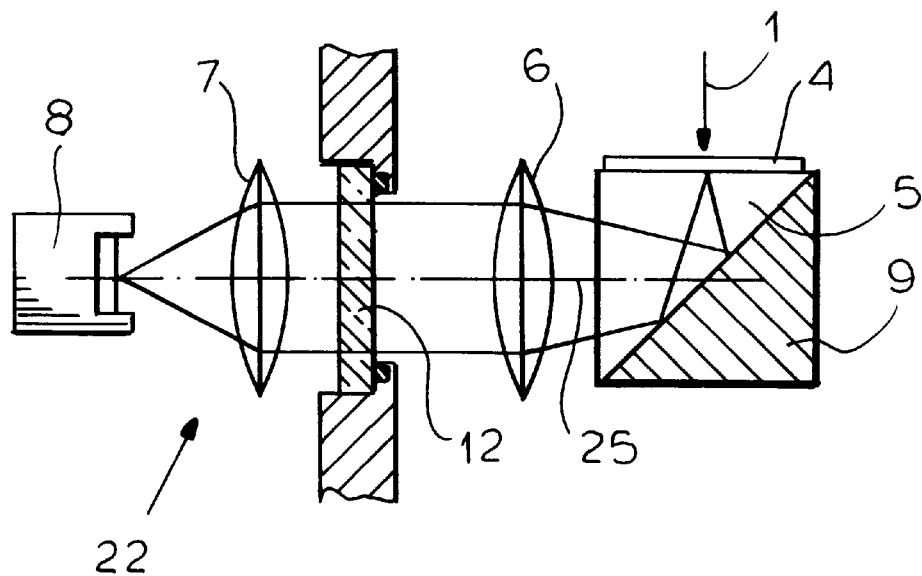
FIG. 2 is a side elevational view in section of a detail of the system of FIG. 1.
Figure 3:
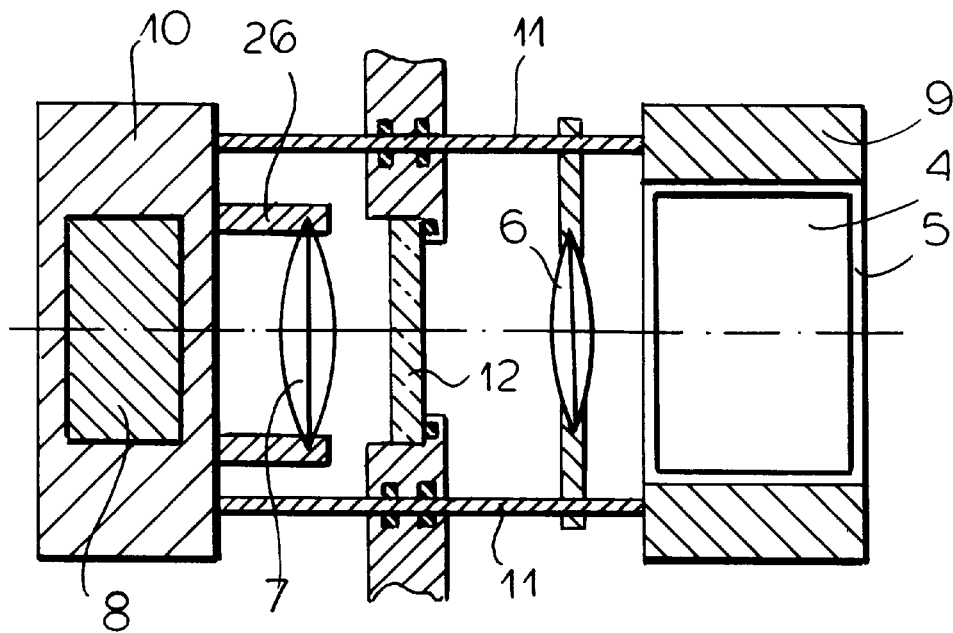
FIG. 3 is a plan view of the camera portion of the system seen in FIG. 2, also in section.

In FIG. 1, a transmission electron microscope is shown which has an electron beam 1 in a projection chamber 2 directed onto a viewing luminescent screen 3. The electron beam generator and the balance of the electron microscope has been represented at 20 in FIG. 1. The projection chamber is evacuated by a suction pump 21 and a camera system 22 can be shiftable by a pneumatic actuator 23 to slide that unit along a guide 24 and on bars 11 relative to the electron beam 1.

More particularly the camera system 22 can comprise a luminescent screen 4 which can be shifted into the beam or withdrawn therefrom, below which, a rerouting optical element 5 in the form of a prism is provided. The camera system includes an optical lens arrangement 6, 7 of the focusing type in optical alignment with the prism 5 along the optical axis 25, a camera 8 which is preferably a high resolution CCD camera.

The assembly of the luminescent screen 4, the prism 5, the lens system 6, 7 and the camera 8, is fixed by a rigid structure shown at 9, 10, 11 which is shiftable by the pneumatic actuator 23 relative to the housing 2 of the electron microscope.

In the active position of the camera system, the luminescent screen 4 is in the path of the electron beam I and transforms the electron image into a photon image. The prism 5 reroutes that photon image at a right angle to the path of the electron beam 1 and the image is focused in the camera 8 by the lens optics 6, 7.

The luminescent screen 4, the rerouting element 5 and a part 6 of the lens optics, as well as part of the structure 9, 10, 11, is located within the electron microscope, i.e. within the housing 2. The remaining part 7 of the lens optics and the CCD camera are located outside the electron microscope. The two parts of the lens optics are separated by a vacuum window 12 in the wall of the evacuated projection chamber the window 12 passing the optical image to the camera. The bars 11 of the structural unit 9, 10, 11 pass slidably through the wall of the housing 2. The elements connected to these bars include a support 9 for the luminescent screen and the prism, and a support 10 for the camera.

Adjustment of the image ratio can be effected upon the original mount of the camera system by appropriate positioning of the lens 6 and 7 on the bars 11 or on a housing 26 connected to the camera support 10. Spherical aberration is eliminated by the selection and design of, said, lens 7.

We claim:

1. A transmission electron microscope comprising:

a housing;

an electron beam generator on said housing directing an electron beam along a transmission electron microscopy path within said housing;

a luminescent screen in said housing transverse to said path and insertable in said path for transforming an electron image into a photon image;

an optical element juxtaposed with said luminescent screen for rerouting said photon image through a right angle;

a camera outside said housing in optical alignment with said optical element for registering said photon image;

a focussing lens optics spaced from said optical element and said camera and in optical alignment with said optical element and said camera; and a structure fixing said luminescent screen, said optical element, said camera and said focussing lens optics together for joint movement relative to said path.

2. The transmission electron microscope defined in claim 1 wherein said optical element is a prism.

3. The transmission electron microscope defined in claim 2 wherein said camera is a high resolution CCD camera.

4. The transmission electron microscope defined in claim 3 wherein said structure forms a pneumatically actuated slide.

5. The transmission electron microscope defined in claim 4 wherein said structure comprises at least two rods extending through a wall of said housing, said wall being formed with a vacuum window, said focusing lens optics including lenses on opposite sides of said window.

6. The transmission electron microscope defined in claim 1 wherein said camera is a high resolution CCD camera.

7. The transmission electron microscope defined in claim 1 wherein said structure forms a pneumatically actuated slide.

8. The transmission electron microscope defined in claim 1 wherein said structure comprises at least two rods extending through a wall of said housing, said wall being formed with a vacuum window, said focusing lens optics including lenses on opposite sides of said window.

* * * * *